United States Patent
Wang et al.

(10) Patent No.: US 10,209,285 B2
(45) Date of Patent: Feb. 19, 2019

(54) ELECTROMETER

(71) Applicants: Tsinghua University, Beijing (CN); HON HAI PRECISION INDUSTRY CO., LTD., New Taipei (TW)

(72) Inventors: Xin-He Wang, Beijing (CN); Dong-Qi Li, Beijing (CN); Jiang-Tao Wang, Beijing (CN); Wen-Yun Wu, Beijing (CN); Yu-Jun He, Beijing (CN); Peng Liu, Beijing (CN); Qing-Yu Zhao, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 138 days.

(21) Appl. No.: 14/983,605

(22) Filed: Dec. 30, 2015

(65) Prior Publication Data
US 2016/0187404 A1 Jun. 30, 2016

(30) Foreign Application Priority Data
Dec. 31, 2014 (CN) .......................... 2014 1 0849967

(51) Int. Cl.
*G01R 29/12* (2006.01)
(52) U.S. Cl.
CPC .................... *G01R 29/12* (2013.01)
(58) Field of Classification Search
CPC ........................... G06F 3/0483; G06F 3/04842
USPC ........................................ 324/451, 452, 457
See application file for complete search history.

(56) References Cited

U.S. PATENT DOCUMENTS

| | | | | |
|---|---|---|---|---|
| 5,430,292 | A * | 7/1995 | Honjo | G03F 1/86 250/310 |
| 7,230,431 | B2 * | 6/2007 | Mirme | G01N 15/1031 324/123 C |
| 8,502,786 | B2 | 8/2013 | Jiang et al. | |
| 8,614,693 | B2 | 12/2013 | King et al. | |
| 9,323,398 | B2 | 4/2016 | Bernstein et al. | |
| 2002/0183207 | A1 | 12/2002 | Hjortstam et al. | |
| 2006/0076503 | A1 * | 4/2006 | Tsao | H01J 37/228 250/396 R |
| 2006/0273263 | A1 * | 12/2006 | Raymond | G01B 11/0616 250/492.2 |

(Continued)

FOREIGN PATENT DOCUMENTS

| CN | 1381059 | 11/2002 |
|---|---|---|
| CN | 101937279 A | 1/2011 |

(Continued)

*Primary Examiner* — Giovanni Astacio-Oquendo
(74) *Attorney, Agent, or Firm* — ScienBiziP, P.C.

(57) ABSTRACT

An electrometer includes a sensing module and a control module. The sensing module includes an electrostatic sensing element. The electrostatic sensing element includes two opposite ends. Each end of the electrostatic sensing element is electrically connected to the control module. When an object with electrostatic charge is near but does not touch the electrostatic sensing element, the resistance of the electrostatic sensing element can be changed. The control module electrically connect to the electrostatic sensing element, the control module measures the resistance variation ΔR of the electrostatic sensing element and converts the resistance variation ΔR into the static electricity potential.

20 Claims, 7 Drawing Sheets

(56) References Cited

U.S. PATENT DOCUMENTS

| | | | |
|---|---|---|---|
| 2009/0027057 A1* | 1/2009 | Anderson | H04L 12/10 |
| | | | 324/457 |
| 2009/0045816 A1* | 2/2009 | Robinson | G01R 29/24 |
| | | | 324/457 |
| 2010/0328258 A1 | 12/2010 | Cheng et al. | |
| 2011/0304579 A1 | 12/2011 | Feng et al. | |
| 2012/0050180 A1 | 3/2012 | King et al. | |

FOREIGN PATENT DOCUMENTS

| | | |
|---|---|---|
| CN | 102236439 A | 11/2011 |
| CN | 101859216 | 1/2012 |
| CN | 102483673 | 5/2012 |
| CN | 103168284 | 6/2013 |
| CN | 103235195 | 8/2013 |
| TW | I416380 | 11/2013 |
| TW | M478871 | 5/2014 |
| WO | 2014009781 A1 | 1/2014 |

\* cited by examiner

ELECTROMETER

CROSS-REFERENCE TO RELATED APPLICATIONS

This application claims all benefits accruing under 35 U.S.C. § 119 from China Patent Application No. 201410849967.7, filed on Dec. 31, 2014, in the China Intellectual Property Office. This application is related to commonly-assigned application entitled, "ELECTROMETER", concurrently filed Ser. No. 14/983,604; "ELECTROSTATIC DISTRIBUTION MEASURING INSTRUMENT", concurrently filed Ser. No. 14/983,601. Disclosures of the above-identified applications are incorporated herein by reference.

FIELD

The present application relates to an electrometer.

BACKGROUND

Electrometer is an electrical instrument for measuring the static electricity potential. The electrometer can be divided into two categories: contact electrometer and non-contact electrometer. Compared with the contact electrometer, the non-contact electrometer based on the principle of electrostatic induction is less influenced by input capacitance and input resistance. The measurement accuracy of a non-contact electrometer is better than a contact electrometer. However, the non-contact electrometer can not be used to monitor the static electricity potential for the test value of the non-contact electrometer will decay exponentially with time.

What is needed, therefore, is to provide an electrometer to monitor the static electricity potential.

BRIEF DESCRIPTION OF THE DRAWINGS

Implementations of the present technology will now be described, by way of example only, with reference to the attached figures, wherein.

DETAILED DESCRIPTION

Figure 1:
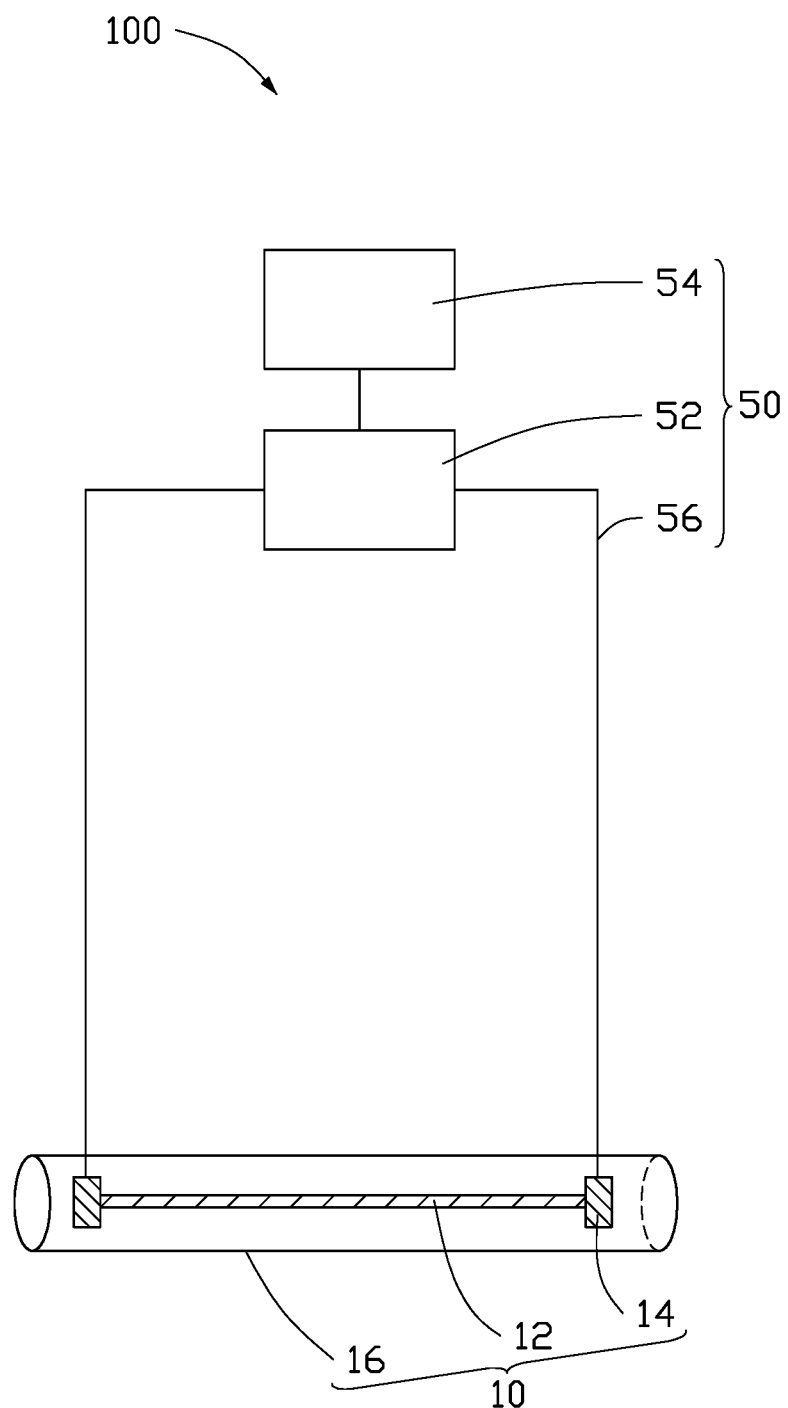
FIG. 1 is a schematic view of one embodiment of an electrometer.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Referring to FIG. 1, an electrometer 100 of one embodiment includes a sensing module 10 and a control module 50 electrically connected to the sensing module 10.

The sensing module 10 includes an electrostatic sensing element 12 and two electrodes 14 electrically connected to the electrostatic sensing element 12. The electrostatic sensing element 12 includes two opposite ends. The two electrodes 14 are separately located on the two opposite ends.

The electrostatic sensing element 12 can be one-dimensional semiconducting linear structure in nanoscale with single crystal structure. A diameter of the one-dimensional semiconducting linear structure in nanoscale is less than 100 nanometers. When a measured object with electrostatic charge is near but does not touch the electrostatic sensing element 12, the resistance of the electrostatic sensing element 12 can be changed. The resistance change can be obtained by detecting current change of the electrostatic sensing element 12. The measured object with any static charge can be regarded as the measured object with electrostatic charge in this disclosure. In some embodiments, a user's finger(s) are as an example of the measured object with electrostatic charge.

The one-dimensional semiconducting linear structure in nanoscale can be a semiconducting linear structure with larger length diameter ratio. The length diameter ratio of the one-dimensional semiconducting linear structure is greater than 1000:1.

The electrostatic sensing element 12 can be semiconducting graphene strips with a width of less than 10 nanometers, a thickness of less than 5 nanometers, and a length of greater than 1 centimeter. The electrostatic sensing element 12 can be one semiconducting silicon nanowire with a diameter of less than or equal to 5 nanometers, and a length of greater than 1 centimeter. The electrostatic sensing element 12 can be one ultra long single walled carbon nanotube or few-walled carbon nanotube. The few-walled carbon nanotube is a carbon nanotube with wall of from about two layers to about six layers. In one embodiment, the few-walled carbon nanotube has two or three layers wall.

When a measured object with electrostatic charge is near but does not touch the one-dimensional semiconducting linear structure in nanoscale, the resistance of the one-dimensional semiconducting linear structure in nanoscale can be changed. The measured object can be recognized by a device because the resistance of the one-dimensional semiconducting linear structure in nanoscale is changed. An electric field generated by static electricity of the measured object can easily affect Fermi surface moving of the one-dimensional semiconducting linear structure in nanoscale. Electric field outside the one-dimensional semiconducting linear structure in nanoscale would affect Fermi surface movement of the one-dimensional semiconducting linear structure in nanoscale. Conductivity of the one-dimensional semiconducting linear structure in nanoscale significantly changes with the Fermi surface movement of the one-dimensional semiconducting linear structure in nanoscale.

The one-dimensional semiconducting linear structure in nanoscale has excellent response to the electric field of the send object for below reasons. Almost the one-dimensional semiconducting linear structure in nanoscale can not constitute an electric field shielding, and it can be completely regulated by external electric field. While electric field applied on a three-dimensional conductive material can hardly affect internal of the three-dimensional conductive material, because of the three-dimensional conductive material having a strong surface shielding. Due to the quantum confinement effect, the electron density of states (DOS) of one-dimensional material would have many singularities. While the Fermi surface is moving near the singularity, the electronic density of states will dramatically changes. The dramatic changes of the electronic density of states would lead to the conductivity of the one-dimensional semiconducting linear structure in nanoscale significant changes.

Therefore, electrostatic can modulate the Fermi surface moving in the vicinity of the singularity in the one-dimensional semiconducting linear structure in nanoscale, to get a significant change in the electrical conductivity of the semiconducting linear structure in nanoscale. Therefore, the measured object with electrostatic charge can be recognized by the one-dimensional semiconducting linear structure in nanoscale when the measured object is near but does not touch the semiconducting linear structure in nanoscale. In order to realize this sensing static function, the distance between the Fermi surface and the singularity of the one-dimensional semiconducting linear structure in nanoscale should be within a specific range.

Figure 2:
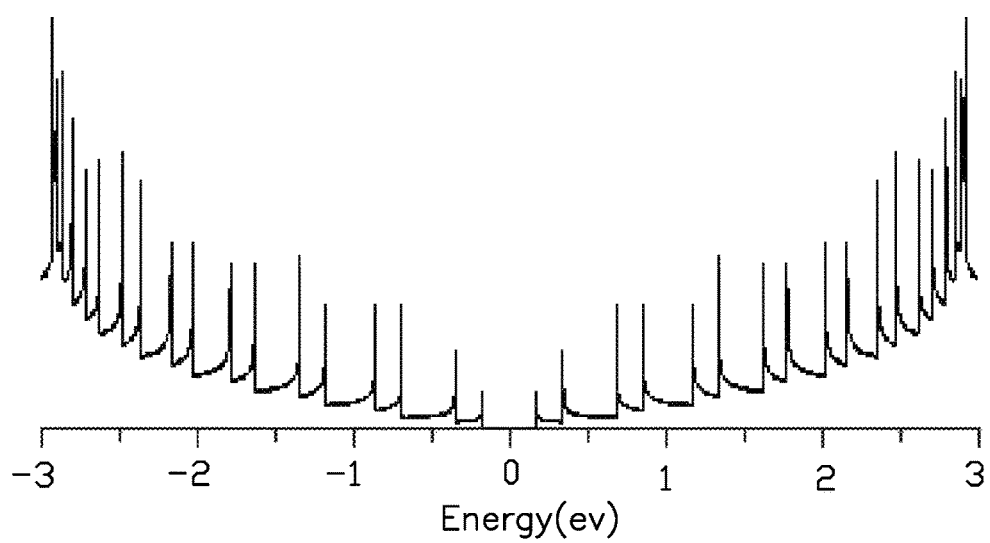
FIG. 2 is an electron density of state distribution curve of carbon nanotube.
Figure 3:
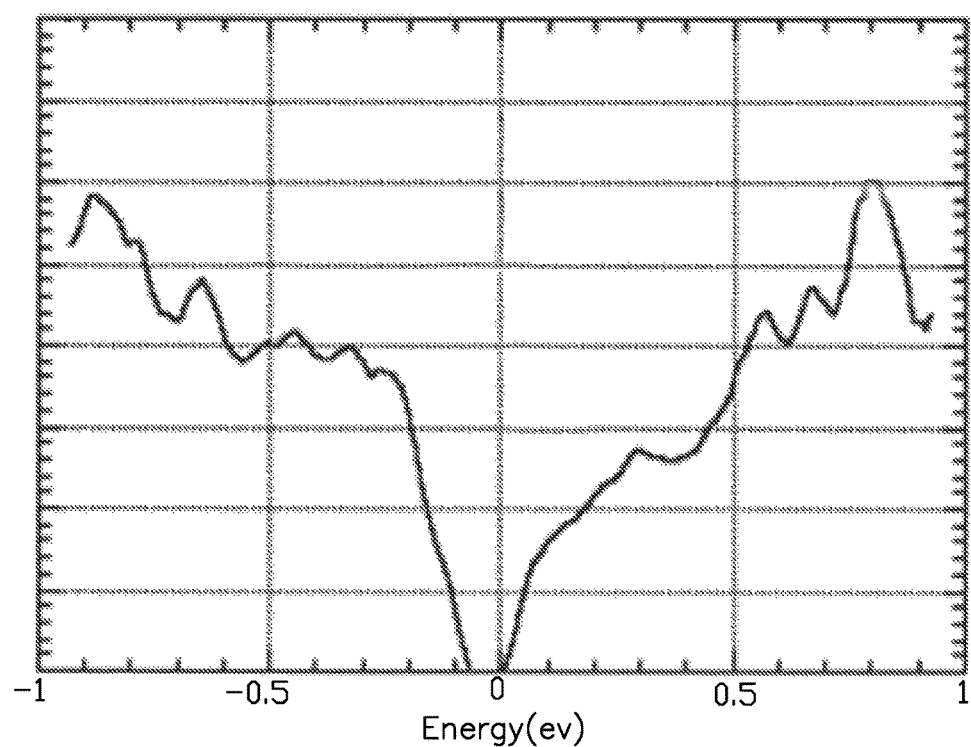
FIG. 3 is an electron density of state distribution curve of carbon nanotube under normal temperature measured by Scanning tunneling spectroscopy (STS).

As shown in FIG. 2, the electron density of states distribution curve of the carbon nanotube have a lot of singularities. The electron density of states of the carbon nanotube takes great value at the point of the singularity. Distribution of singularities is relatively symmetrical to 0 eV place. In an ideal state without making any doping, the Fermi level locates on 0 eV place. The above properties are all one-dimensional semiconducting linear structure common characteristics. As previously mentioned, a sensitive response to the electrostatic requires Fermi surface moving in the vicinity of the singularity of one-dimensional semiconducting linear structure. So that there is a need to make the Fermi level to raise or decrease to the neighborhood singularity nearest to 0 eV. Referring to FIG. 3, in practice, due to the thermal excitation, surface adsorption and interaction with the surrounding environment, the singularities of one-dimensional semiconducting linear structure will be broadened into a half-height peak with a width L. The peaks are always to be buried because the overlap of the peaks. But, the rising edge of peak singularity nearest 0 eV is always present. To make the one-dimensional semiconducting linear structure having sensitive response to electrostatic, the Fermi surface needs to be fixed at a place with a distance to the singularity less than L/2. In practical applications, to obtain sensitive response to electrostatic, through natural doping or manual doping, to make the energy distance between the Fermi surface and the singularity of the one-dimensional semiconducting linear structure within a range of 30 meV~300 meV.

Carbon nanotubes prepared sample exposed to air, since the formation of oxygen adsorbed p-type doped, the energy distance from the Fermi surface to singular points in the state density falls within 30~300 meV, preferably 60 to fall within 100 meV. Therefore, thereby manual prepared natural carbon nanotubes have electrostatic sensitive electrostatic response. Graphene strips, semiconducting nanowires (e.g. silicon nanowires) can adsorb oxygen to form a p-type doping. A doping can also be used to adjust energy distance between the Fermi surface and the singular point in the state density within a distance of 30~300 meV.

When the measured object with electrostatic charge nears the one-dimensional material semiconducting linear structure in nanoscale, the Fermi level of the one-dimensional semiconducting linear structure in nanoscale would be modulated, the corresponding density of states will change, and the conductivity will change consequently. Therefore, when considering the sensitivity of the process, it is needed to focus on two things: first, modulation efficiency of the measured object to the Fermi level of the one-dimensional semiconducting linear structure in nanoscale; second, the change rate of the density of states with the Fermi level moving of the one-dimensional semiconducting linear structure in nanoscale.

With respect to the first point, this is strongly influenced by the substrate material, the surface adsorption and other environmental factors. It is impossible to quantitatively determine the modulation efficiency of the measured object to the Fermi level of the one-dimensional semiconducting linear structure in nanoscale theoretically. The modulation efficiency of the measured object to the Fermi level of the one-dimensional semiconducting linear structure can only be obtained from experimental measurements. Silica, for example, a sample of the silica substrate, the modulation efficiency is measured as $4\times10^{-5}$. The second point is a requirement about the one-dimensional semiconducting linear structure in nanoscale, which requires the absolute value of $(d\sigma/dE_F)/(\sigma/E_F)$ greater than $10^{-1}$, or greater than $10^{-3}$ ($\sigma$ is the conductivity of the one-dimensional semiconducting linear structure in nanoscale, $E_F$ is the Fermi surface location of the one-dimensional semiconducting linear structure in nanoscale). In this condition, when the measured objection is close to the one-dimensional semiconducting linear structure in nanoscale, the conductivity change is not less than 10% in favor to signal detection.

When using carbon nanotubes with the diameter distribution of 2-3 nm (carbon nanotubes are located on a silica substrate), the conductivity of the carbon nanotubes reduce by half ($d\sigma/\sigma\sim\frac{1}{2}$), when a measured object with electrostatic charge 1000V is close to the carbon nanotubes at a place 0.5 centimeter far from the carbon nanotubes. The modulation efficiency is measured as $4\times10^{-5}$, $dE_F\sim40$ meV. The $E_F$ of the carbon nanotubes is $E_F\sim150$ meV. Thus, the absolute value of $(d\sigma/dE_F)/(\sigma/E_F)$ of the carbon nanotube is about 2. The graphene strips, the semi-conductive nano-wires can satisfy the requirement of $(d\sigma/dE_F)/(\sigma/E_F)$ is greater than $10^{-1}$, or greater than $10^{-3}$. If it is just to achieve a qualitative sense the presence or absence of the measured object with static electricity, $(d\sigma/dE_F)/(\sigma/E_F)$ of one-dimensional semiconducting linear structure in nanoscale is greater than $10^{-3}$. If it is to quantify the amount of sensing electrostatic or sense the position of the measured object with static electricity, $(d\sigma/dE_F)/(\sigma/E_F)$ of one-dimensional semiconducting linear structure in nanoscale is greater than $10^{-1}$.

One single walled carbon nanotube or few-walled carbon nanotube is quasi-one-dimensional structure. The smaller the diameter of the quasi-one-dimensional structure is, the density of state (DOS) of the quasi-one-dimensional structure is greater. The greater the DOS of the quasi-one-dimensional structure is, the shielding effect of the quasi-one-dimensional structure is smaller. And accordingly, the smaller the shielding effect of the quasi-one-dimensional structure is, the sensibility of sensing static electricity of the quasi-one-dimensional structure is greater. Therefore, the smaller the diameter of the single walled carbon nanotube or few-walled carbon nanotube is, the sensibility of sensing position coordinate of the measured object is greater.

The diameter of the single walled carbon nanotube or few-walled carbon nanotube can be less than about 5 nanometers. In one embodiment, the diameter of the single walled carbon nanotube or few-walled carbon nanotube is in a range from about 2 nanometers to about 5 nanometers. In one embodiment, the diameter of the single walled carbon nanotube or few-walled carbon nanotube is about 2 nanometers. The length of the single walled carbon nanotube or few-walled carbon nanotube is not limited. The longer the length of the electrostatic sensing element 12 is, the measurement space of the electrostatic sensing element 12 is greater, the measurement accuracy of the electrostatic sensing element 12 is worse. In one embodiment, the length of the single walled carbon nanotube or few-walled carbon nanotube is less than or equal to 5 micrometers.

The sensing module 10 can further includes a substrate 16. The substrate 16 is made of insulating materials. The insulating materials can be rigid materials such as glass, quartz, diamond or any other suitable material. The insulating materials can also be flexible materials such as plastic, resin or any other suitable material. A shape and size of the substrate 16 can be selected according to need. The substrate 16 can support and protect the electrostatic sensing element 12. In one embodiment, the substrate 16 is a hollowed column. The electrostatic sensing element 12 and the electrode 14 can be completely or partially covered by the substrate 16. The length of the hollowed column is greater than the electrostatic sensing element 12, the sidewall thickness of the hollowed column is about 1 micrometers. The electrostatic sensing element 12 and the two electrodes 14 are disposed within the cavity of the hollowed column. Alternatively, the electrostatic sensing element 12 and electrode 14 can be located on the surface of the substrate 16. It is also to be understood that it does not affect the function of the electrometer 100 without the substrate 16, the substrate 16 is optional.

The two electrodes 14 can be formed by conductive material, such as Au, Ag, Cu, Pd, or indium tin oxide (ITO). The shape of the two electrodes 14 is not limited. In one embodiment, the electrostatic sensing element 12 and the two electrodes 14 are located on the surface of the substrate 16, the two electrodes 14 is made of Ag, and located on the two opposite ends of the electrostatic sensing element 12 respectively. It is also to be understood that the electrostatic sensing element 12 can be directly connected to the measuring unit 52 without the two electrodes 14, the two electrodes 14 is optional.

The control module 50 includes a measuring unit 52 and a processing unit 54. The measuring unit 52 is used to measure the resistance variation $\Delta R$ of the electrostatic sensing element 12 and transmit the resistance variation $\Delta R$ to the processing unit 54. The processing unit 54 is used to convert the resistance variation $\Delta R$ into the static electricity potential. Data can transmit between the measuring unit 52 and the processing unit 54. Data transmission between the processing unit 54 and the measuring unit 52 may be wireless transmission or wired transmission. In wireless transmission, the distance between the processing unit 54 and the measuring unit 52 can be very long.

The measuring unit 52 is electrically connected to the two opposite ends of the electrostatic sensing element 12. The measuring unit 52 can be directly connected to the electrostatic sensing element 12. The measuring unit 52 can also be connected to the electrostatic sensing element 12 via the two electrodes 14. In one embodiment, the measuring unit 52 is electrically connected to the two electrodes 14 via two supporting bars 56 which can support the electrostatic sensing element 12. The two supporting bars 56 can be made of a metal that has good electrical conductivity. In one embodiment, the two supporting bars 56 are made of copper, the length of the two supporting bars 56 is about 20 cm and the diameter is about 0.5 cm. It is understood that the two supporting bar 56 can be replaced by other conductive connector.

The measuring unit 52 is used to measure the resistance variation $\Delta R$ of the electrostatic sensing element 12 and transmit the resistance variation $\Delta R$ to the processing unit 54. The resistance variation $\Delta R$ can be calculated using the following equation: $\Delta R = R' - R$, wherein R is the initial resistance of the electrostatic sensing element 12 without the measured object, and R' is the resistance of the electrostatic sensing element 12 when the measured object with electrostatic charge is near but does not touch the electrostatic sensing element 12. The method to obtain the resistance R' or R is not limited, such as voltammetry or wheatstone bridge. In one embodiment, the resistance is obtained by the voltammetry method, which comprises the following steps: applying a voltage U to the electrostatic sensing element 12 and detecting the current of the electrostatic sensing element 12; recording the current of the electrostatic sensing element 12 without the measured object, and recording the current of the electrostatic sensing element 12 when the measured object with electrostatic charge is near but dose not touch the electrostatic sensing element 12. The resistance variation $\Delta R$ is calculated using the following equation: $\Delta R = U/I - U/I'$, wherein I is the current of the electrostatic sensing element 12 without the measured object, I' is the current of the electrostatic sensing element 12 when the measured object with electrostatic charge is near but dose not touch the electrostatic sensing element 12. The distance between the electrostatic sensing element 12 and the measured object can range from about 1 mm to about 50 mm. In one embodiment, the distance between the electrostatic sensing element 12 and the measured object is 25 mm. The measurement range of the electrometer 100 can be changed by adjustment of the distance between the electrostatic sensing element 12 and the measured object.

The processing unit 54 is used to convert the resistance variation $\Delta R$ into the static electricity potential. The resistance variation $\Delta R$ measured by the measuring unit 52 is send to the processing unit 54, and converted into the static electricity potential by the processing unit 54.

In one embodiment, the processing unit 54 includes a converting unit (not shown) and an output unit (not shown). The converting unit is used to convert the resistance variation ΔR into the static electricity potential. The output unit is used to output the results of the converting unit. The output results may be a value, light, sound or other signals.

The electrometer 100 may further include an alarm unit (not shown) which monitors the static electricity potential. When the static electricity potential reaches a preset threshold, the alarm unit sends out alarm signals.

Figure 4:
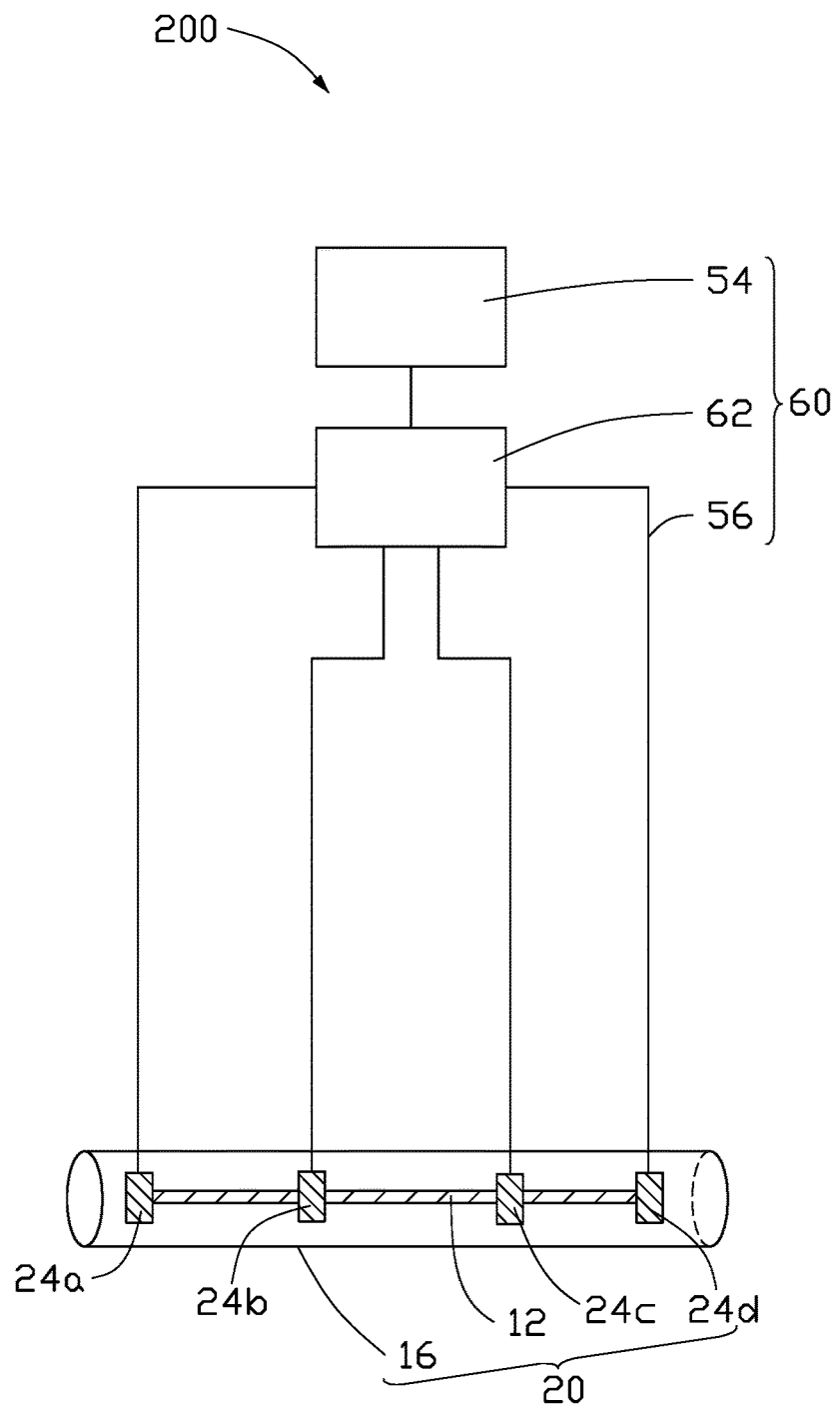
FIG. 4 is a schematic view of one embodiment of an electrometer.

Referring to FIG. 4, an electrometer 200 of one embodiment includes a sensing module 20 and a control module 60 electrically connected to the sensing module 10.

The sensing module 20 includes an electrostatic sensing element 12, a first electrode 24a, a second electrode 24b, a third electrode 24c and a fourth electrode 24d. The first electrode 24a, the second electrode 24b, the third electrode 24c and the fourth electrode 24d are sequentially located along a longitudinal direction of the electrostatic sensing element 12. The first electrode 24a and the fourth electrode 24d are located on the two opposite ends of the electrostatic sensing element 12. The second electrode 24b and the third electrode 24c are located on the middle part of the electrostatic sensing element 12. When the measured object with electrostatic charge is near, but does not touch, the electrostatic sensing element 12, the resistance of the electrostatic sensing element 12 can be changed.

The control module 60 is electrically connected to the electrostatic sensing element 12 via the four electrodes 14. The control module 60 includes a measuring unit 62 and the processing unit 54. The measuring unit 62 is used to measure the resistance variation ΔR of the electrostatic sensing element 12 by Four-terminal sensing method. The Four-terminal sensing method comprises the following steps: applying a current I to the electrostatic sensing element 12 via the first electrode 24a and the fourth electrode 24d, and detecting the voltage between the second electrode 24b and the third electrode 24c. The resistance variation ΔR can be calculated using the following equation: $\Delta R = U/I - U'/I$, wherein U is the voltage between the second electrode 24b and the third electrode 24c without the measured object, U' is the voltage between the second electrode 24b and the third electrode 24c when the measured object with electrostatic charge is near but dose not touch the electrostatic sensing element 12. The resistance variation ΔR measured by the measuring unit 62 is send to the processing unit 54 and converted into the static electricity potential.

The electrometer 200 in the embodiment shown in FIG. 4 is similar to the electrometer 100 in the embodiment shown in FIG. 1, except that the electrometer 200 measures the resistance variation ΔR by Four-terminal sensing method which can improve the measurement accuracy by reducing the influences of lead resistance and electrode resistance.

Figure 5:
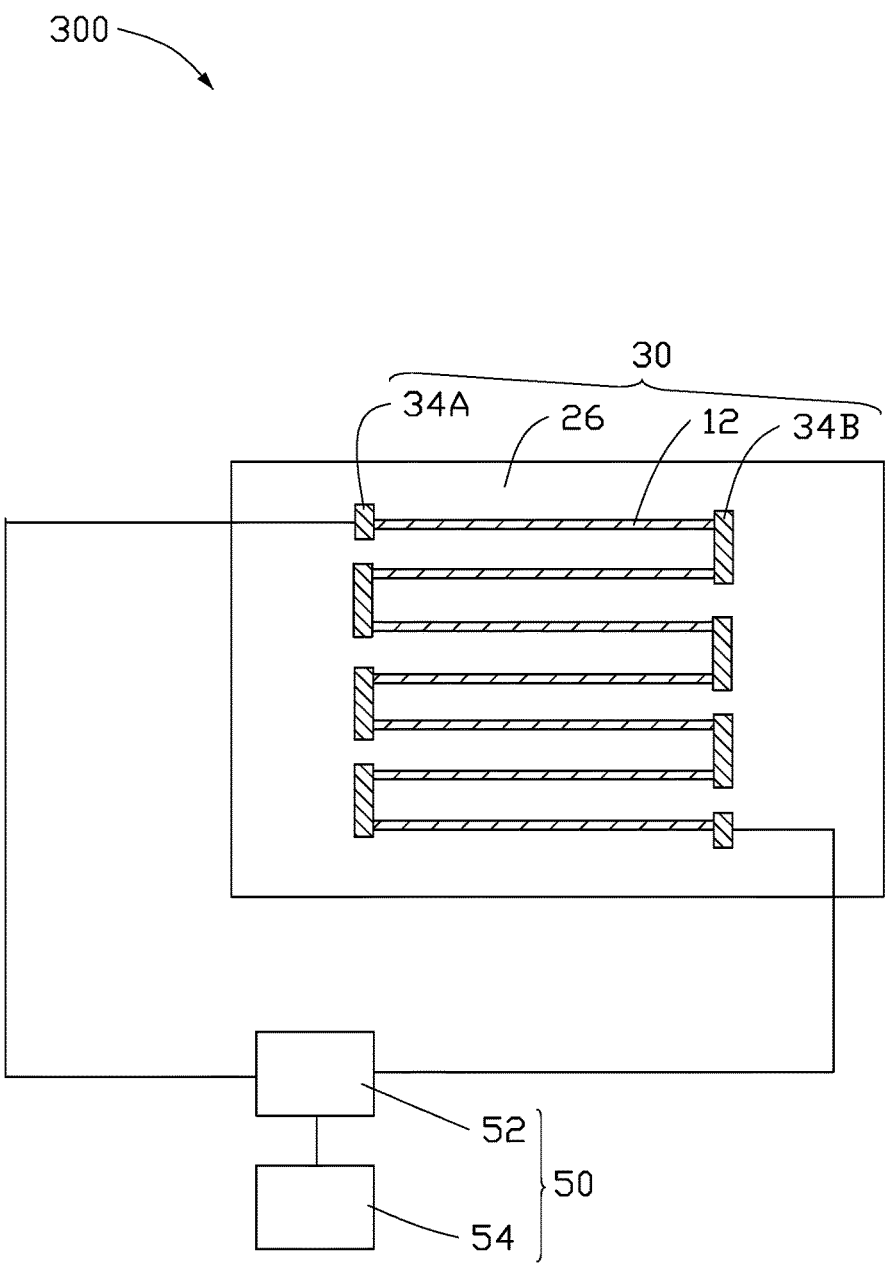
FIG. 5 is a schematic view of one embodiment of an electrometer.

Referring to FIG. 5, an electrometer 300 of one embodiment includes a sensing module 30 and a control module 50 electrically connected to the sensing module 30.

The sensing module 30 includes a plurality of electrostatic sensing elements 12, two first electrodes 34A, and a plurality of second electrodes 34B. The number of the sensing elements 12 is N and the number of the second electrodes 34B is N−1. N is an integer greater than 1. The N electrostatic sensing elements 12 are spaced apart from each other. The N electrostatic sensing elements 12 are connected in series via the N−1 second electrodes 34B. The N electrostatic sensing elements 12 and the N−1 second electrodes 34B are alternately arranged in a series connection. The series connection has two ends. Each end of the series connection is electrically connected to a first electrode 34A. When the measured object with electrostatic charge is near but does not touch the series connection, the resistance of the series connection can be changed.

The control module 50 includes a measuring unit 52 and a processing unit 54. The measuring unit 52 is electrically connected to the two ends of the series connection. The measuring unit 52 is used to measure the resistance variation ΔR of the series connection and transmit the resistance variation ΔR to the processing unit 54.

The electrometer 300 in the embodiment shown in FIG. 5 is similar to the electrometer 100 in the embodiment shown in FIG. 1, except that the electrometer 300 includes N electrostatic sensing elements 12. The N electrostatic sensing elements 12 are insulated from each other. The arrangement of the N electrostatic sensing elements 12 is not limited. In one embodiment, the N electrostatic sensing elements 12 are substantially parallel to each other. The distance between two adjacent electrostatic sensing elements 12 can be in a range from about 2 mm to about 2 cm.

In one embodiment, the sensing module 30 includes seven electrostatic sensing elements 12, two first electrodes 34A, and six second electrodes 34B. The seven electrostatic sensing elements 12 are substantially parallel to each other. The distance between two adjacent electrostatic sensing elements 12 is about 3 mm. Each of the electrostatic sensing elements 12 comprises a single walled carbon nanotube or few-walled carbon nanotube. The single walled carbon nanotube or few-walled carbon nanotube has a diameter of about 3 nm, and a length of about 10 mm.

The electrometer 300 includes N electrostatic sensing elements 12 in series which can increase the sensing area and sensitive. The electrometer 300 is more suitable when the measured object has a certain area and low static electricity potential.

Figure 6:
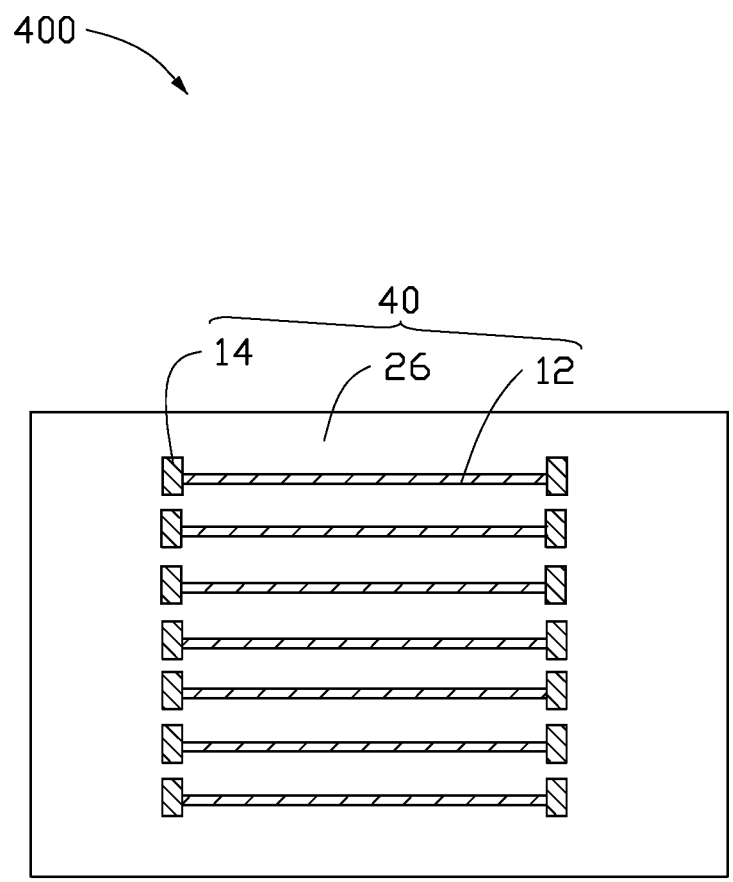
FIG. 6 is a schematic view of a sensing module in the embodiment shown in FIG. 5.
Figure 7:
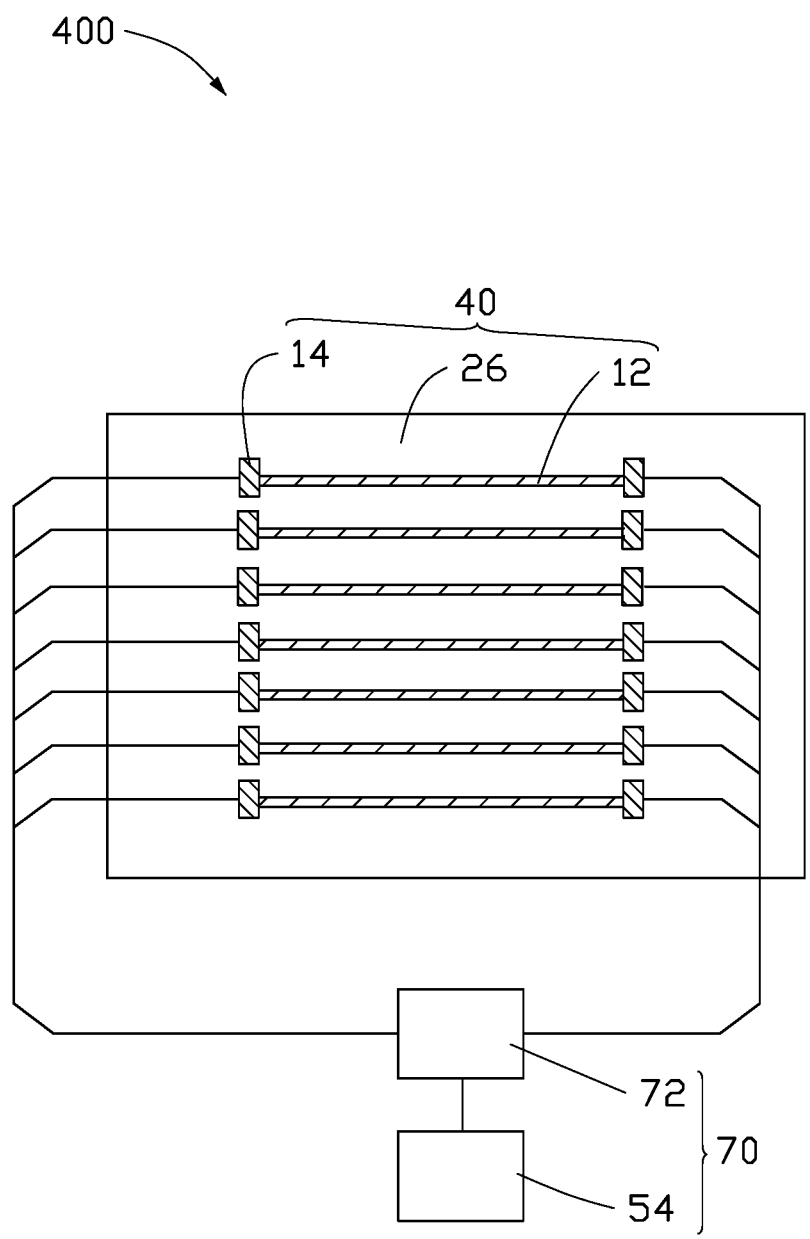
FIG. 7 is a schematic view of one embodiment of an electrostatic distribution measuring instrument.

Referring to FIG. 6 and FIG. 7, an electrostatic distribution measuring instrument 400 of one embodiment includes a sensing module 40 and a control module 70 electrically connected to the sensing module 40.

The sensing module 40 includes a plurality of electrostatic sensing elements 12. The number of the sensing elements 12 is N, where N is an integer greater than 1. The N electrostatic sensing elements 12 are spaced apart from each other. Each of the N electrostatic sensing elements 12 includes two opposite ends. Each end of the N electrostatic sensing elements 12 is connected to the control module 70.

The control module 70 includes a measuring unit 72 and a processing unit 54. The measuring unit 72 is electrically connected to the N electrostatic sensing elements 12. The measuring unit 72 is used to measure the resistance variation ΔR of each of the N electrostatic sensing elements 12 and transmit the resistance variation ΔR to the processing unit 54. The measuring unit 72 may measure each of the N resistance variation ΔR simultaneously, or measure each of the N resistance variation ΔR sequentially. It is understood that the control module 70 can also be replaced by N control module 50.

The electrostatic distribution measuring instrument 400 in the embodiment shown in FIG. 7 is similar to the electrometer 100 in the embodiment shown in FIG. 1, except that the electrostatic distribution measuring instrument 400 includes N electrostatic sensing elements 12. The control module 70 is electrically connected to the N electrostatic sensing elements 12 and measures the resistance variation ΔR of each of the N electrostatic sensing elements 12. The N electrostatic sensing elements 12 are insulated from each other. The arrangement of the N electrostatic sensing elements 12 is not limited. In one embodiment, the N electrostatic sensing elements 12 are substantially parallel to each other. The distance between two adjacent electrostatic sensing elements 12 can be in a range from about 2 mm to about 2 cm.

In one embodiment, the sensing module 40 includes seven electrostatic sensing elements 12. The seven electrostatic sensing elements 12 are substantially parallel to each other. The distance between two adjacent electrostatic sensing elements 12 is about 3 mm. Each of the electrostatic sensing elements 12 comprises a single walled carbon nanotube or few-walled carbon nanotube. The single walled carbon nanotube or few-walled carbon nanotube has a diameter of about 3 nm, and a length of about 10 mm.

The electrostatic distribution measuring instrument 400 includes N electrostatic sensing elements 12 connected to the control module 70 respectively. The electrostatic distribution measuring instrument 400 can measure a electrostatic distribution of the measured object, especially when the measured object has a certain shape.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may include some indication in reference to certain steps. However, the indication used is only to be viewed for identification purposes and not as a suggestion as to an order for the steps.

What is claimed is:

1. An electrometer comprising:
a sensing module comprising an electrostatic sensing element comprising two opposite ends;
a control module electrically connected to the two opposite ends;
wherein the electrostatic sensing element is single walled carbon nanotube or few-walled carbon nanotube, the control module is configured to measure a resistance variation $\Delta R$ of the electrostatic sensing element and convert the resistance variation $\Delta R$ into a static electricity potential.

2. The electrometer of claim 1, wherein the few-walled carbon nanotube is a carbon nanotube with wall of from two layers to six layers.

3. The electrometer of claim 1, wherein a diameter of the electrostatic sensing element is less than or equal to 5 nm but greater than 0 nm.

4. The electrometer of claim 1, wherein the control module comprises a measuring unit and a processing unit; wherein the measuring unit is electrically connected to the electrostatic sensing element, the measuring unit is configured to measure the resistance variation $\Delta R$ of the electrostatic sensing element and transmit the resistance variation $\Delta R$ to the processing unit, and the processing unit is configured to convert the resistance variation $\Delta R$ into the static electricity potential.

5. The electrometer of claim 1, wherein the electrometer further comprises two electrodes located on the two opposite ends of the electrostatic sensing element, and the control module is coupled to the electrostatic sensing element via the two electrodes.

6. The electrometer of claim 1, wherein the electrometer further comprises a insulating substrate, the electrostatic sensing element is located on a surface of the insulating substrate.

7. The electrometer of claim 6, wherein the insulating substrate is flexible.

8. The electrometer of claim 1, wherein the electrometer further comprises an alarm unit which monitoring the static electricity potential; and when the static electricity potential reaches a preset threshold, the alarm unit sends out alarm signals.

9. The electrometer of claim 1, wherein the distance between the electrostatic sensing element and the measured object ranges from about 1 mm to about 50 mm.

10. The electrometer of claim 9, wherein the distance between the electrostatic sensing element and the measured object is 25 mm.

11. The electrometer of claim 1, wherein a diameter of the electrostatic sensing element ranges from 2 nm to 5 nm.

12. An electrometer comprising:
a sensing module comprising an electrostatic sensing element, a first electrode, a second electrode, a third electrode, and a fourth electrode; wherein the first electrode and the fourth electrode are located on the two opposite ends of the electrostatic sensing element, and the second electrode and the third electrode are located on a middle part of the electrostatic sensing element;
a control module coupled to the electrostatic sensing element via the first electrode, the second electrode, the third electrode, and the fourth electrode;
wherein the electrostatic sensing element is single walled carbon nanotube or few-walled carbon nanotube, the control module is configured to measure a resistance variation $\Delta R$ of the electrostatic sensing element and convert the resistance variation $\Delta R$ into a static electricity potential.

13. The electrometer of claim 12, wherein the few-walled carbon nanotube is a carbon nanotube with wall of from two layers to six layers.

14. The electrometer of claim 12, wherein a diameter of the electrostatic sensing element is less than or equal to 5 nm but greater than 0 nm.

15. The electrometer of claim 12, wherein the control module comprises a measuring unit and a processing unit, the measuring unit is electrically connected to the electrostatic sensing element, the measuring unit is configured to measure the resistance variation $\Delta R$ of the electrostatic sensing element and transmit the resistance variation $\Delta R$ to the processing unit, the processing unit is configured to convert the resistance variation $\Delta R$ into the static electricity potential.

16. The electrometer of claim 12, wherein the electrometer further comprises a insulating substrate, the electrostatic sensing element is located on a surface of the insulating substrate.

17. The electrometer of claim 16, wherein the insulating substrate is flexible.

18. The electrometer of claim 12, wherein the electrometer further comprises an alarm unit which monitoring the static electricity potential; and when the static electricity potential reaches a preset threshold, the alarm unit sends out alarm signals.

19. The electrometer of claim 12, wherein the distance between the electrostatic sensing element and the measured object ranges from about 1 mm to about 50 mm.

20. The electrometer of claim 19, wherein the distance between the electrostatic sensing element and the measured object is 25 mm.

* * * * *